United States Patent [19]
Arita et al.

[11] Patent Number: 6,140,672
[45] Date of Patent: Oct. 31, 2000

[54] FERROELECTRIC FIELD EFFECT TRANSISTOR HAVING A GATE ELECTRODE BEING ELECTRICALLY CONNECTED TO THE BOTTOM ELECTRODE OF A FERROELECTRIC CAPACITOR

[75] Inventors: Koji Arita; Carlos A. Paz de Araujo, both of Colorado Springs, Colo.

[73] Assignees: Symetrix Corporation, Colorado Springs, Colo.; Matsushita Electronics Corporation, Japan

[21] Appl. No.: 09/263,639

[22] Filed: Mar. 5, 1999

[51] Int. Cl.[7] ................................................ H01L 29/76
[52] U.S. Cl. .......................... 257/295; 257/300; 257/296; 438/3
[58] Field of Search ....................... 438/3, 631; 257/295, 257/296, 300, 311, 532, 535, FOR 295, FOR 300, FOR 311, FOR 535

[56] References Cited

U.S. PATENT DOCUMENTS

| | | | |
|---|---|---|---|
| 5,495,117 | 2/1996 | Larson | 257/295 |
| 5,536,672 | 7/1996 | Miller et al. | 438/3 |
| 5,767,541 | 6/1998 | Hanagasaki | 257/295 |
| 5,789,775 | 8/1998 | Evans, Jr. et al. | 257/295 |
| 5,864,153 | 1/1999 | Nagel et al. | 257/296 |

FOREIGN PATENT DOCUMENTS

| | | |
|---|---|---|
| 4102367A | 4/1992 | Japan . |
| 6125057A | 4/1992 | Japan . |

*Primary Examiner*—Donald L. Monin, Jr.
*Assistant Examiner*—Hoai Pham
*Attorney, Agent, or Firm*—Duft, Graziano & Forest, P.C.

[57] ABSTRACT

A ferroelectric non-volatile memory in which each memory cell consists of a metal-ferroelectric-metal ("MFM") capacitor and a FET on a semiconductor substrate. The MFM and the FET are separated by an interlayer dielectric layer. A local interconnect connects the gate electrode of the FET to the bottom electrode of the MFM capacitor. Preferably, the MFM is located directly above the gate electrode, and the local interconnect is a conductive plug in a filled via. Preferably, the ferroelectric thin film of the MFM comprises a layered superlattice material. Preferably, a dielectric metal oxide insulator layer is located between the gate electrode and the semiconductor substrate.

22 Claims, 10 Drawing Sheets

6,140,672

FERROELECTRIC FIELD EFFECT TRANSISTOR HAVING A GATE ELECTRODE BEING ELECTRICALLY CONNECTED TO THE BOTTOM ELECTRODE OF A FERROELECTRIC CAPACITOR

BACKGROUND OF THE INVENTION

1. Field of the Invention

This invention relates to ferroelectric field effect transistors, and more particularly to ferroelectric memories utilizing such transistors and methods of fabricating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. Destructive reading followed by rewriting generally requires operating a memory with two transistors and two capacitors ("2T-2C"), which reduces overall circuit density and efficiency, as well as increase manufacturing costs.

It has been postulated for at least 40 years, however, that it may be possible to design a nonvolatile, nondestructive read-out ("NDRO") memory in which the memory element is a single ferroelectric field effect transistor ("FET"), thereby reducing at least some of the complexity of conventional 2T-2C operation. See Shu-Yau Wu, "A New Ferroelectric Memory Device, Metal-Ferroelectric-Semiconductor Transistor", in *IEEE Transactions On Electron Devices*, pp. 499–504, August 1974; S. Y. Wu, "Memory Retention and Switching Behavior Of Metal-Ferroelectric-Semiconductor Transistors", in *Ferroelectrics*, Vol. 11, pp. 379–383, 1976; and J. R. Scott, C. A. Paz De Araujo, and L. D. McMillan, "Integrated Ferroelectrics", in *Condensed Matter News*, Vol. 1, No. 3, pp. 15–20, 1992. Because the ferroelectric memory effect measured in the early devices of Wu was only a temporary, single state effect rather than a long-lived, two state effect, it is now believed that this effect was charge injection effect rather than an effect due to ferroelectric switching.

A structure well-known in the art is the so-called metal-ferroelectric-semiconductor FET ("MFS-FET"), in which a ferroelectric layer is formed on the semiconductor substrate, and the metal gate electrode is located on the ferroelectric layer. Typically, the ferroelectric layer comprises a ferroelectric metal oxide. When a ferroelectric metal oxide, such as PZT, is formed directly on a semiconductor substrate, such as silicon, high leakage current, low retention times and fatigue are common problems. It is commonly believed in the art that some of this is a result of a poor interface between ferroelectric oxides and silicon. The poor interface may be a result of incompatibility of crystalline ferroelectric oxides with the crystal lattices and thermal coefficients of silicon.

Also, when a thin film of ferroelectric oxide is in direct electrical connection with the gate oxide layer of the transistor gate, it is difficult to apply sufficient voltage to the ferroelectric thin film to switch its polarization. A ferroelectric thin film and a gate oxide may be viewed as two capacitors in series. The dielectric constant of the ferroelectric thin film (usually 100–1000) is much higher than the dielectric constant of typical gate oxides (usually about 3–5). As a result, most of the voltage drop occurs across the low dielectric constant material, and an extra high operational voltage is required to switch the polarization of the ferroelectric thin film. This can lead to electrical breakdown of the gate oxide and other materials in the circuit. Further, a high operational voltage in excess of 3–5 volts would render the device incompatible with conventional integrated circuit art.

To reduce interface problems, structures have been designed in which an insulating oxide layer, such as $CeO_2$ or $Y_2O_3$, is sputter-deposited on the semiconductor substrate and the gate oxide before depositing the ferroelectric layer and gate. Such an integrated structure is referred to in the art as a metal-ferroelectric-insulator-semiconductor FET ("MFIS-FET"). Recently, a metal-ferroelectric-insulator-semiconductor FET device ("MFIS-FET") has been reported that appears to show true ferroelectric memory behavior. See Tadahiko Hirai et al., "Formation of Metal/Ferroelectric/Insulator/Semiconductor Structure With A $CeO_2$ Buffer Layer", in *Japanese Journal of Applied Physics*, Vol. 33, Part I, No. 9B, pp. 5219–5222, September 1994; Tadahiko Hirai et al., "Characterization of Metal/Ferroelectric/Insulator/Semiconductor Structure With A $CeO_2$ Buffer Layer", in *Japanese Journal of Applied Physics*, Vol. 34, Part I, No. 8A, pp. 4163–4166, August 1995; Tadahiko Hirai et al., "Crystal and Electrical Characterizations of Epitaxial $Ce_xZr_{1-x}O_2$ Buffer Layer for the Metal/Ferroelectric/Insulator/Semiconductor Field Effect Transistor", in *Japanese Journal of Applied Physics*, Vol.35, Part I, No. 9A, pp.5150–5153, September 1996; Yong Tae Kim et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol. 71 No. 24, Dec. 15, 1997, pp. 3507–3509; and U.S. Pat. No. 5,744,374 issued Apr. 28, 1998 to Jong Moon. It is believed that an insulator layer located on the silicon substrate between the substrate and the ferroelectric thin film avoids the problems caused by a ferroelectric-semiconductor interface. Related integrated structures, in which the ferroelectric is structurally integrated with the transistor element, contain the equivalent of a floating gate electrode located between the semiconductor and the ferroelectric, and are sometimes referred to as a metal-ferroelectric-metal-insulator-semiconductor ("MFMIS-FET") or a metal-ferroelectric-metal-semiconductor ("MFMS-FET"), depending on the presence of an insulating layer.

The MFS-, MFIS-, MFMS- and MFMIS-FET and other related structurally integrated memories also share the problem of being structures that are fundamentally different from the structures of commercially fabricated ferroelectric random access memory ("FeRAM") and dynamic random access memory ("DRAM") cells, of which the fabrication processes have been proven and perfected. Therefore, expensive and time-consuming development of commercially effective fabrication processes and corresponding investment in new manufacturing facilities will be necessary before MFIS-FETs and related integrated structures can be commercially available.

SOLUTION

The invention solves the problems described above by providing new structures and fabrication methods for a segregated NDRO ferroelectric FET memory cell. The NDRO memory cell of the invention is segregated in that it comprises a ferroelectric capacitor that is spatially and structurally separated from the FET. The ferroelectric capacitor typically includes a bottom electrode, a thin film of ferroelectric material, and a top electrode. This structure is designated in this disclosure as a metal-ferroelectric-metal ("MFM") capacitor.

An advantageous feature of the invention is that the FET portion of the inventive memory cell has essentially the same structure and is fabricated using the same manufacturing steps as a conventional MOSFET. The FET portion of the invention includes a source region, a drain region, a channel region, a gate oxide and a gate electrode. The gate oxide is usually formed in steps to oxidize the underlying semiconductor substrate; for example, silicon is oxidized to form silicon dioxide. The gate oxide acts as an insulating layer, causing a capacitance effect. In addition, an insulator layer of dielectric material, typically a metal oxide, may be formed on the gate oxide between the gate electrode and the semiconductor substrate. Thus, whether the particular embodiment includes only a conventional gate oxide or both a gate oxide and a dielectric insulator layer, the gate electrode and the insulating material form a capacitor on the semiconductor substrate. This structure is designated in this disclosure as a metal-insulator-semiconductor ("MIS") capacitor.

In the ferroelectric FET memory of this invention, the bottom electrode of the MFM capacitor is located closer than the top electrode of the MFM capacitor to the gate electrode of the MIS capacitor. A local interconnect electrically connects the gate electrode of the MIS capacitor to the bottom electrode of the MFM capacitor. The electrically connected MFM capacitor and MIS capacitor together form a ferroelectric MFM-MIS FET memory cell.

The MFM capacitor of the inventive MFM-MIS memory is spatially and structurally separated from the MIS structure, typically by one or more interlayer dielectric layers. Since the ferroelectric thin film is not in contact with the semiconductor substrate, the interface problems inherent in MFS-FETs are avoided.

The structure and method of the invention are applicable in embodiments containing any type of ferroelectric material in the ferroelectric thin film. Nevertheless, the invention is especially useful when the ferroelectric material is a metal oxide because the metal oxides are prone to interface problems. Preferably, the ferroelectric metal oxide used is a layered superlattice material instead of the ABO$_3$-type oxides of the prior art, such as PZT or PZLT. Use of a layered superlattice material, such as strontium bismuth tantalate, SrBi$_2$Ta$_2$O$_9$, results in a MFM-MIS FET memory with improved resistance to fatigue and reduced leakage current, as well as a larger voltage window available for reading binary data from the memory cell.

An important functional advantage of the segregated structure of the invention is that the ferroelectric MFM capacitor can be made much smaller than the gate elements of the MIS. The capacitance of a capacitor is approximately linearly proportional to its active area, that is, the area between the two electrodes of the capacitor. By decreasing the area size of the MFM capacitor, it is possible to reduce the capacitance value of the MFM capacitor, thereby increasing the voltage drop across the MFM capacitor available for polarization switching. The MFM and the MIS of the inventive MFM-MIS FET memory are manufactured in fabrication steps that are significantly independent of each other. As a result, the relative physical sizes of the MFM and MIS are not directly tied. As explained above, a problem in MFIS-FETs and other integrated memories is that the relatively low dielectric constant of gate oxides reduces the voltage available for switching the polarization of the ferroelectric. But, in a segregated MFM-MIS FET of the invention, the gate oxide and gate electrode area sizes can be made very large compared to a relatively small size of the MFM capacitor. As a result, a correspondingly smaller voltage drop occurs across the MIS of the gate, and the write-voltage applied to the top electrode of the MFM provides a sufficiently large electric field across the ferroelectric thin film to switch polarization.

Another important feature of the invention is that the gate electrode is electrically connected to the bottom electrode. Conceptually viewed, the segregated structure of the invention is not as dense as MFIS-FETs and other integrated memories because the MFM is separated from the FET, thereby increasing the overall volume and decreasing the density of the circuit. The overall circuit density of the MFM-MIS FET is increased, however, by connecting the gate electrode to the bottom electrode of the MFM, rather than to its top electrode. The MIS capacitor and the MFM capacitor can be connected in a "strapped" configuration, in which the MFM is displaced laterally from the MIS below, and the local interconnect connects the top of the gate electrode to the upper surface of the bottom electrode. The overall circuit density can be maximized by forming the MFM capacitor directly above the MIS capacitor in a stacked configuration, and using a conductive plug in a filled via to connect the top of the gate electrode to the lower surface of the bottom electrode. An additional advantage of using the local interconnect to connect the gate to the bottom electrode is that the degree of proximity of the local interconnect to the MFM is minimized, thereby reducing the risk of electrical shorting between elements of the MFM.

In the MFM-MIS FET memory cell of the invention, binary data is typically written to the cell by applying a voltage to the top electrode, which sets the polarization in the ferroelectric thin film of the capacitor. The polarization in the ferroelectric determines the relative conductivity of the channel region in the semiconductor substrate. Data is nondestructively read by applying a drain bias and sensing the drain-to-source current across the channel region. Although an electrical circuit diagram of the segregated memory cell of the invention is similar to a circuit diagram of the MFIS-FET and related integrated structures mentioned above, the structural configuration of the inventive segregated MFM-MIS FET cell more closely resembles the structure of conventional memory cells, especially FeRAMs. Thus, another important feature of the invention is that the new segregated MFM-MIS memory can be fabricated using methods and processes that are similar to the proven methods for commercial fabrication of FeRAM and DRAM cells. The invention, therefore, not only provides a simpler and more dense ferroelectric memory, but also provides one that can be manufactured easily and reliably. Numerous other features, objects and advantages of the invention will become apparent from the following description when read in conjunction with the accompanying drawings.

DETAILED DESCRIPTION OF THE PREFERRED EMBODIMENT

1. Introduction

Figure 1:
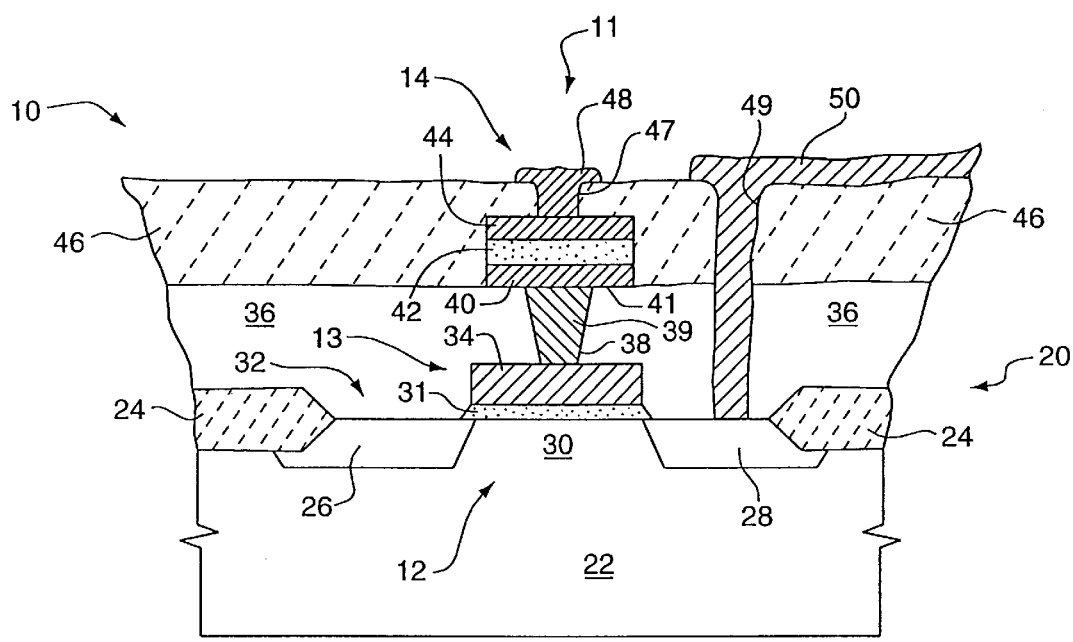
FIG. 1 shows a cross-sectional view of a preferred embodiment of a MFM-MIS FET memory cell according to the invention, having a stacked configuration.

It should be understood that FIGS. 1, 2, 4, 5 and 7 depicting sections of integrated circuit devices are not meant to be actual plan or cross-sectional views of any particular portion of an actual integrated circuit device. In the actual devices, the layers will not be as regular and the thicknesses may have different proportions. The figures instead show idealized representations which are employed only to more clearly and fully depict the structure and method of the invention than would otherwise be possible.

In the MFM-MIS memory of the invention, the MFM capacitor is in series with the MIS capacitor. When a write voltage is applied to the top electrode of the MFM capacitor, the portion of the total voltage drop across each of the series capacitors is approximately inversely linearly proportional to the capacitance of the respective capacitor. Thus, the relative value of the voltage drop across the ferroelectric MFM capacitor compared to the voltage drop across the MIS structure is $C_{MIS}/C_{MFM}$; that is, when $C_{MFM}$ is large, the voltage drop across the MFM capacitor is small. To increase the amount of voltage drop available for polarization switching in the ferroelectric thin film of the MFM, it is desirable to decrease $C_{MFM}$ and increase $C_{MIS}$.

The capacitance of a capacitor is approximately inversely linearly proportional to the thickness of the dielectric layer. One way to decrease $C_{MFM}$, therefore, is to increase the thickness of the ferroelectric thin film of the MFM capacitor. Increased thickness, however, reduces overall circuit density. Thus, there is usually some upper limit to the thickness of the ferroelectric thin film that is determined by operational constraints. For this reason, at the present time, the thickness of the ferroelectric thin film should not exceed 500 nm. To increase $C_{MIS}$, the thickness of the gate oxide and the insulator layer should be made as thin as possible. The thickness of a naturally formed gate oxide, in embodiments where such an oxide is used, is usually dependent on process conditions, so it is not always easy to control. The thickness of an insulator layer can be varied by choice of deposition methods and parameters.

The capacitance of a capacitor is also approximately linearly proportional to its area. By decreasing the area size of the MFM capacitor, $A_{MFM}$, relative to the area of the MIS capacitor, $A_{MIS}$, it is possible to reduce the relative capacitance value of the MFM capacitor, thereby increasing the voltage drop across the MFM capacitor available for polarization switching. The capacitance-determining area of a capacitor is the smallest area of one of its elements. The MFM capacitor of the invention comprises: a top electrode, having an area $A_t$; a bottom electrode, having an area $A_b$; and a ferroelectric thin film, having an area $A_f$. Thus, the capacitance-determining area of the MFM capacitor is the smallest of $A_t$, $A_b$, and $A_f$. Typically, $A_t$ is the smallest area, and in this disclosure, the area of the top electrode is designated $A_{MFM}$, although it is understood that $A_b$ or $A_f$ may determine the value of $A_{MFM}$ in other embodiments. Similarly, in this disclosure, the area of the gate, $A_g$, is designated $A_{MIS}$, although the area of the gate oxide or semiconductor below the gate oxide could determine $A_{MIS}$, in other embodiments. While in the preferred embodiment, $A_{MFM}$ is smaller than $A_{MIS}$, it is understood that the invention also contemplates other embodiments in which $A_{MFM}$ is equal to or larger than $A_{MIS}$.

It is believed that the threshold voltage shift, $\Delta V$, of a MFM-MIS FET memory is approximately equal to $2 V_c$, that is, two times the coercive voltage, in the ferroelectric thin film of the MFM. The threshold voltage shift, which appears as the shift of the C–V curves in capacitance versus voltage measurements of MFM-MIS capacitors, is also referred to as the "memory window". To increase the size of the memory window, therefore, the value of $2 V_c$ of the ferroelectric thin film should be increased. The coercive voltage of a ferroelectric increases with film thickness because as film thickness increases, a higher voltage is required to generate a coercive electric field across the ferroelectric thin film, that is, an electric field strong enough to switch polarization. There is, therefore, a lower limit to the thickness of the ferroelectric thin film of the MFM capacitor, depending on the ferroelectric characteristics of the particular composition of the ferroelectric thin film. For currently used layered superlattice materials, such as $SrBi_2Ta_2O_9$ and $SrBi_2(Ta_{1-x}Nb_x)_2O_9$, the minimum thickness of the ferroelectric thin film is about 100 nm.

FIG. 1 shows a cross-sectional view of a portion of a MFM-MIS FET memory 10 including a memory cell 11 according to a preferred embodiment of the invention. The MFM-MIS FET memory cell 11 comprises a field effect transistor ("FET") 12, a metal-ferroelectric-metal ("MFM")

capacitor 14, and an interconnect 39. Metal-insulator-semiconductor ("MIS") capacitor 13 forms a portion of FET 12. Although the overall structure including the combination of components shown in FIG. 1 is not in the prior art, the individual components that make up the combination, i.e. each of FET 12, MIS 13, MFM 14, and interconnect 39 have structures essentially identical to structures in the prior art, and they can be manufactured using standard techniques for manufacturing MOSFETs and FeRAMS. The inventive MFM-MIS FET memory 10 is formed on a wafer 20, comprising a standard semiconductor material 22, preferably p-100 crystalline silicon. A semiconductor substrate 32 comprises those elements of the memory cell that are formed from semiconductor material 22 of wafer 20. A field oxide layer 24, typically thermally oxidized silicon oxide or SiON, is formed in semiconductor substrate 32 using conventional techniques. Semiconductor substrate 32 also comprises a highly doped source region 26 and a highly doped drain region 28, which are formed about channel region 30 using conventional techniques. Doped source region 26 and drain region 28 are preferably n-type doped regions. Gate oxide layer 31 is located above channel region 30, and gate electrode 34 is located above gate oxide layer 31, both of which are preferably formed by conventional techniques. Semiconductor substrate 32 comprises semiconductor material 22, source region 26, drain region 28, channel region 30, and gate oxide layer 31. FET 12 comprises source region 26, drain region 28, channel region 30, gate oxide layer 31 and gate electrode 34. MIS capacitor 13 comprises gate electrode 34, gate oxide 31 and semiconductor substrate 32. FET 12 and MIS 13 are covered by a standard interlayer dielectric ("ILD") 36, comprising a glasseous oxide, preferably a boron-doped phosphosilicate glass ("BPSG"). A via 38 from the top ILD 36 down to the surface of gate electrode 34 is filled with interconnect 39, also referred to herein by the conventional term conductive plug 39. Conductive plug 39 typically comprises polycrystalline silicon or tungsten, preferably silicon. A bottom electrode 40 having a bottom surface 41 is located on ILD 36, covering conductive plug 39. Conductive plug 39 electrically connects gate electrode 34 to bottom surface 41 of bottom electrode 40. A ferroelectric thin film 42 is located on bottom electrode 40, and top electrode 44 is located on ferroelectric thin film 42. Ferroelectric thin film 42 typically comprises a ferroelectric metal oxide, preferably a layered superlattice material, such as strontium bismuth tantalum niobate, a particular formulation of which is $SrBi_{2.2}Ta_{1.4}Nb_{0.6}O_9$. Bottom electrode 40, ferroelectric thin film 42 and top electrode 44 together form ferroelectric MFM capacitor 14. A second interlayer dielectric, ILD 46, covers ILD 36 and MFM 14. A wiring hole 47 extends through ILD 46 to top electrode 44. Local interconnect 48 filling wiring hole 47 connects top electrode 44 electrically to line through with a write-voltage is typically applied. A wiring hole 49 extends through ILD 46 and ILD 36 to drain region 28. Local interconnect 50 fills wiring hole 49 and electrically connects drain region 28 to a line through which a read-voltage is applied and to which a source-to-drain current sensor (not shown). Source region 26 is generally connected to a voltage source (not shown) either through patterning of doped area 26 in substrate 32 or by way of a local interconnect (not shown).

In a preferred embodiment of the invention, $A_{MFM}$ is less than $A_{MIS}$. As explained above, $A_{MFM}$ is typically $A_t$, the area of top electrode 44, and $A_{MIS}$ is typically $A_g$, the area of gate electrode 34. Preferably, $A_{MFM}/A_{MIS}$ is about 0.1.

In a variation of the preferred embodiment of FIG. 1, an additional insulator layer is located on gate oxide layer 31 between gate electrode 34 and semiconductor substrate 32. The additional insulator layer typically comprises a dielectric metal oxide, such as $CeO_2$, $ZrO_2$, $Y_2O_3$, $(Ce_{1-x}Zr_x)O_2$, where $0 \leq x \leq 1$, preferably $(Ce_{0.1}Zr_{0.9})O_2$, but it may also be any dielectric material that is compatible with the other integrated circuit materials. The exemplary MIS capacitor 400 depicted in FIG. 7 contains an insulator layer 436 of $ZrO_2$.

Ferroelectric thin film 42 preferably comprises a layered superlattice material, and most preferably, a layered superlattice material oxide. Nevertheless, the ferroelectric material contained in the ferroelectric thin film of the invention can include other metal oxides; for example, $ABO_3$-type perovskites. The ferroelectric material may also be a non-oxide metal compound, such as a metal fluoride, or a nonmetallic organic compound.

U.S. Pat. No. 5,519,234, issued May 21, 1996 to Araujo et al., incorporated herein by reference, discloses that layered superlattice compounds, such as strontium bismuth tantalate (SBT), have excellent properties in ferroelectric applications as compared to the best prior art materials and have high dielectric constants and low leakage currents.

The layered superlattice materials may be summarized generally under the formula:

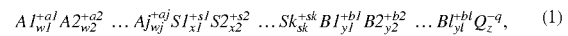

$$A1^{+a1}_{w1} A2^{+a2}_{w2} \ldots Aj^{+aj}_{wj} S1^{+s1}_{x1} S2^{+s2}_{x2} \ldots Sk^{+sk}_{xk} B1^{+b1}_{y1} B2^{+b2}_{y2} \ldots Bl^{+bl}_{yl} Q^{-q}_{z}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements. For example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz. \quad (2)$$

Formula (1) includes all three of the Smolenskii type compounds discussed in U.S. Pat. No. 5,519,234, issued May 21, 1996 to Araujo et al., which is hereby incorporated by reference as though fully incorporated herein. The layered superlattice materials do not include every material that can be fit into formula (1), but only those which spontaneously form themselves into crystalline structures with distinct alternating layers. It has been shown that certain layered superlattice materials possess characteristics well-suited for conventional nonvolatile memory applications, such as high polarizability, high resistance to fatigue, low leakage current, low imprint, and suitable coercive voltage values.

Figure 2:
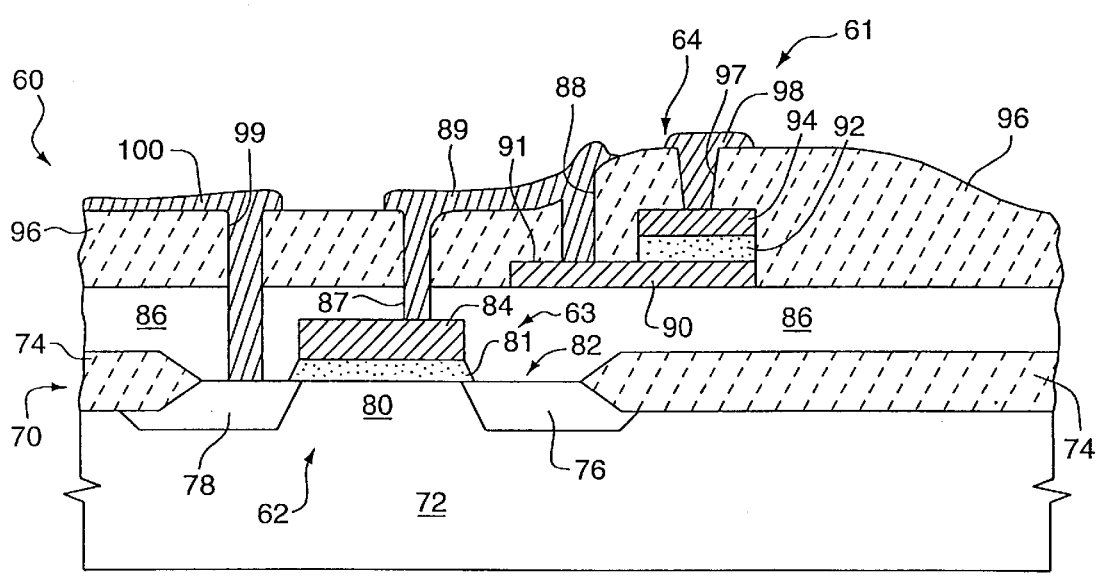
FIG. 2 shows a cross-sectional view of an alternative embodiment of a MFM-MIS FET memory cell according to the invention, having a "strapped" configuration.

An alternative embodiment of the invention is depicted in FIG. 2. In FIG. 2, a portion of MFM-MIS FET memory 60 including memory cell 61 comprises FET 62, MFM capacitor 64, and interconnect 89. MIS capacitor 63 forms part of FET 62. MFM capacitor 64 is displaced laterally with respect to FET 62, instead of being substantially directly above the gate of FET 62. The structure of memory 60 is physically similar to memory cell structures of the prior art, and may be manufactured using conventional processes applied to standard MOSFETs and FeRAMs. The MFM-MIS FET memory cell 61 is formed on a wafer 70, comprising standard semiconductor material 72, preferably p-100 crystalline silicon. A semiconductor substrate 82 comprises those elements of the memory cell 61 that are formed from semiconductor material 72 of wafer 70. A field oxide layer 74, typically thermally oxidized silicon oxide, is formed from semiconductor material 72. A source region 76 and a drain region 78 are formed about a channel region 80. Gate oxide layer 81 is located above channel region 80, and gate electrode 84 is located above gate oxide layer 81. Semiconductor substrate 82 comprises semiconductor material 72, source region 76, drain region 78, channel region 80, and gate oxide layer 81. FET 62 comprises source region 76, drain region 78, channel region 80, gate oxide layer 81 and gate electrode 84 together. MIS capacitor 13 comprises gate electrode 34, gate oxide 31 and semiconductor substrate 32. FET 62 and MIS 63 are covered by a first interlayer dielectric ("ILD") 86, comprising a glasseous oxide, preferably a boron-doped phosphosilicate glass ("BPSG"). A bottom electrode 90 having an upper surface 91 is located on ILD 86. A ferroelectric thin film 92 is located on a portion of bottom electrode 90, and top electrode 94 is located on ferroelectric thin film 92. Ferroelectric thin film 92 typically comprises a ferroelectric metal oxide, preferably a layered superlattice material, such as strontium bismuth tantalum niobate. Bottom electrode 90, ferroelectric thin film 92 and top electrode 94 together form MFM capacitor 64. A second interlayer dielectric, ILD 96, covers ILD 86 and MFM capacitor 64. A wiring hole 87 extends through ILD 96 and ILD 86 to gate electrode 84. Wiring hole 88 extends through ILD 96 to upper surface 91 of bottom electrode 90. Local interconnect 89 fills wiring holes 87 and 88 and electrically connects gate electrode 84 and bottom electrode 90. A wiring hole 97 extends through ILD 96 to top electrode 94. Local interconnect 98 fills wiring hole 97, electrically connecting top electrode 94 to a write-voltage (not shown). A wiring hole 99 extends through ILD 96 and ILD 86 to drain region 78. Local interconnect 100 fills wiring hole 98 and electrically connects drain region 78 to a read-voltage and a source-to-drain current sensor (not shown). Source region 76 is connected to a voltage source (not shown) either through patterning of doped area 76 in substrate 82 or by way of a local interconnect (not shown).

In a variation of the embodiment of FIG. 2, an additional insulator layer comprising dielectric material is located on gate oxide layer 81 between gate electrode 84 and semiconductor substrate 82.

Figure 3:
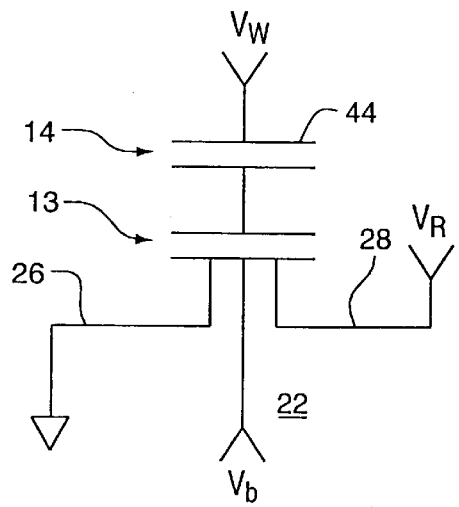
FIG. 3 is an equivalent circuit diagram of the MFM-MIS memory cells of FIGS. 1 and 2.

FIG. 3 shows the equivalent circuit for the MFM-MIS FET memory of FIG. 1. The MFM-MIS FET memory of FIG. 2 is electrically equivalent to the circuit of FIG. 1. In the preferred embodiment, source 26 is held at ground, and a bias voltage, Vb, used to select and deselect the cell is applied to substrate 22. A write bias voltage, Vw, is applied to top electrode 44 of MFM 14 to write to the cell, and a read bias voltage, Vr, is applied to drain 28 in the read process. A source voltage Vs, generally ground or zero volts, is applied to source 26. Voltages Vw and Vr may or may not have the same amplitude.

Figure 4:
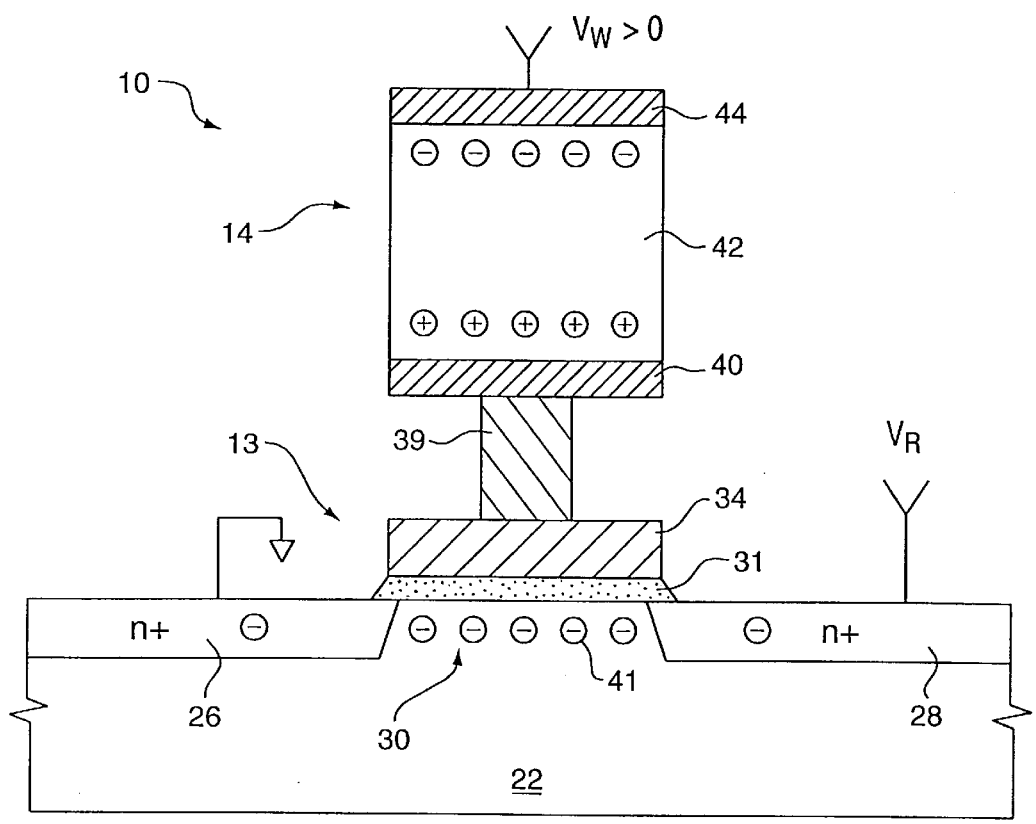
FIG. 4 illustrates the state of polarization of the ferroelectric thin film and the resulting electronic state of the channel region for an arbitrarily selected binary logic "1" state.
Figure 5:
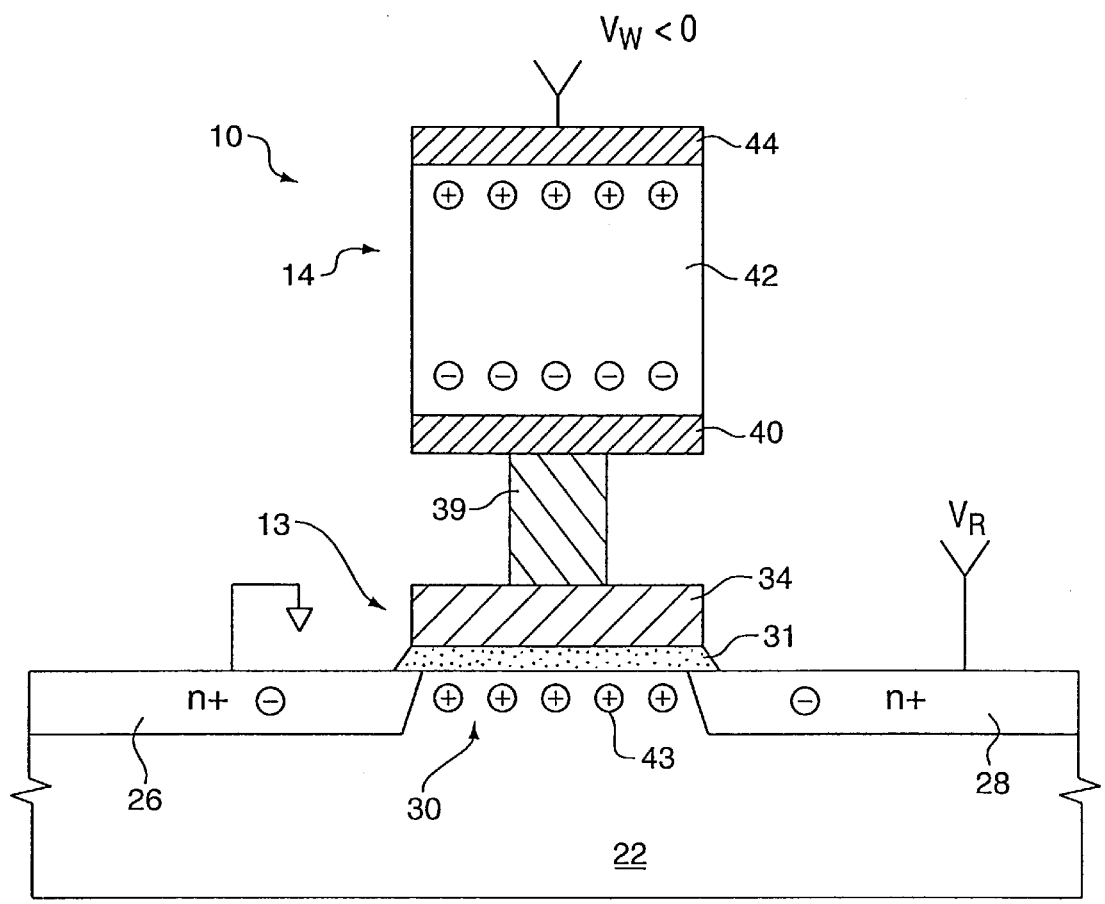
FIG. 5 illustrates the state of polarization of the ferroelectric thin film and the resulting electronic state of the channel region for the logic "0" state.

FIG. 4 illustrates the state of polarization of ferroelectric material 42 and the resulting electronic state of channel region 30 for an arbitrarily selected binary "1" state, while FIG. 5 illustrates the state of polarization of ferroelectric material 42 and the resulting state of channel region 30 for the "0" state. For sake of clarity, ILD layers are not shown in these figures. In these figures, the circles with minus signs, such as 41, represent electrons; the circles with plus signs, such as 43, represent positive holes. When a positive write bias voltage, Vw, is applied to top electrode 44 of MFM 14, then the resulting electric field exerted on ferroelectric thin film 42 causes the ferroelectric metal oxide of thin film 42 to be polarized as shown, even after the voltage and field are no longer applied. The remanent polarization in ferroelectric thin film 42, as depicted in FIG. 4, is transferred through plug 39 to channel region 30, attracting electrons into channel region 30, and thereby causing a surplus of free electrons available for conduction of electric current. As a result, when read voltage, Vr, is applied to drain region 28 in a read operation, a current sensor senses high current across channel region 30, and reads a binary "1" state. When as depicted in FIG. 5, a negative Vw is applied in the write operation, then the resulting polarization in thin film 42 repels electrons, or attracts positive holes, into channel region 30, and the resulting low current when Vr is applied in a read operation is sensed as the binary "0" state. The write bias voltage, Vw, and the read bias voltage, Vr, are typically in the range of 3–5 volts. Voltages Vw and Vr do not have to have the same amplitude.

2. The Fabrication Process

The word "substrate" is often used ambiguously in the art. It can mean the underlying wafer 20 on which an integrated circuit is formed, as well as any object on which a thin film layer is deposited. In this disclosure, "substrate" shall mean the object to which the layer of interest is applied; for example, when we are talking about a ferroelectric thin film, such as thin film 42 in FIG. 1, the substrate includes the elements 22, 31, 36, 39 and 40 on which the ferroelectric thin film is formed. The term "semiconductor substrate" is more specific than substrate. As used herein, "semiconductor substrate 32" refers to those elements of the circuit having origins in the original semiconductor material of the starting wafer, such as from the p-100 crystalline silicon material 22 of FIG. 1. Thus, in the example of the structure of FIG. 1, "semiconductor substrate 32" includes elements 22, 26, 28, 30 and 31.

The term "thin film" is used herein as it is used in the integrated circuit art. Generally, it means a film of less than a micron in thickness. The thin films disclosed herein are in all instances less than 0.5 microns in thickness. The ferroelectric thin film 42, 92 may have a thickness in the range of 30 nm to 500 nm, preferably in the range of 100 nm to 300 nm. If the ferroelectric FET memory includes an additional insulator layer on the gate oxide, then the insulator layer typically has a thickness in the range of 5 nm to 50 nm. These thin films of the integrated circuit art should not be confused with the layered capacitors of the macroscopic capacitor art which are formed by a wholly different process that is incompatible with the integrated circuit art.

In the art, the word "precursor" can mean a solution containing one metal which is mixed with other "precursors" to form intermediate precursors or final precursors, or it may refer to a final precursor mixture, that is, the solution to be applied to the substrate. In this disclosure, the first type of precursor is usually referred to as an "initial precursor" or designated specifically; for example, a "strontium precursor". The precursor as applied to the substrate is usually referred to as a "final precursor", "precursor mixture", or simply "precursor". In any case, the meaning is usually clear from the context.

The term "stoichiometric" herein may be applied to both a solid film of a material or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2Ta_2O_9$ are balanced stoichiometric formulae. In contrast, a precursor for strontium bismuth tantalate in which the molar proportions of strontium, bismuth, and tantalum are 0.9, 2.18, and 2.0, respectively, is represented herein by the unbalanced "stoichiometric" formula $Sr_{0.9}Bi_{2.18}Ta_2O_9$, since it contains excess bismuth and deficient strontium relative to the B-site element tantalum. In this disclosure, an "excess" amount of a metallic element means an amount greater than required to bond with the other metals present to make a completed crystalline structure of the desired material, with all atomic sites occupied and no amount of any metal left over. A "deficient" amount of a metallic element means an amount less than required to bond with the other metals if the other metals were present in stoichiometrically balanced amounts.

Terms of orientation herein, such as "above", "top", "upper", "below", "bottom" and "lower", mean relative to semiconductor substrate 32, 82. That is, if a second element is "above" a first element, it means it is farther from semiconductor substrate 32, 82; and if it is "below" another element then it is closer to semiconductor substrate 32, 82 than the other element. Terms such as "above" and "below" do not, by themselves, signify direct contact. But terms such as "on" or "onto" do signify direct contact of one layer with an underlying layer.

The long dimension of semiconductor substrate 32, 82 defines a plane that is considered to be a "horizontal" plane herein, and directions perpendicular to this plane are considered to be "vertical". Terms such as "lateral", "laterally" and "to the side" refer to the direction of the flat plane of semiconductor substrate 32, 82, that is, parallel to the horizontal direction.

Figure 6:
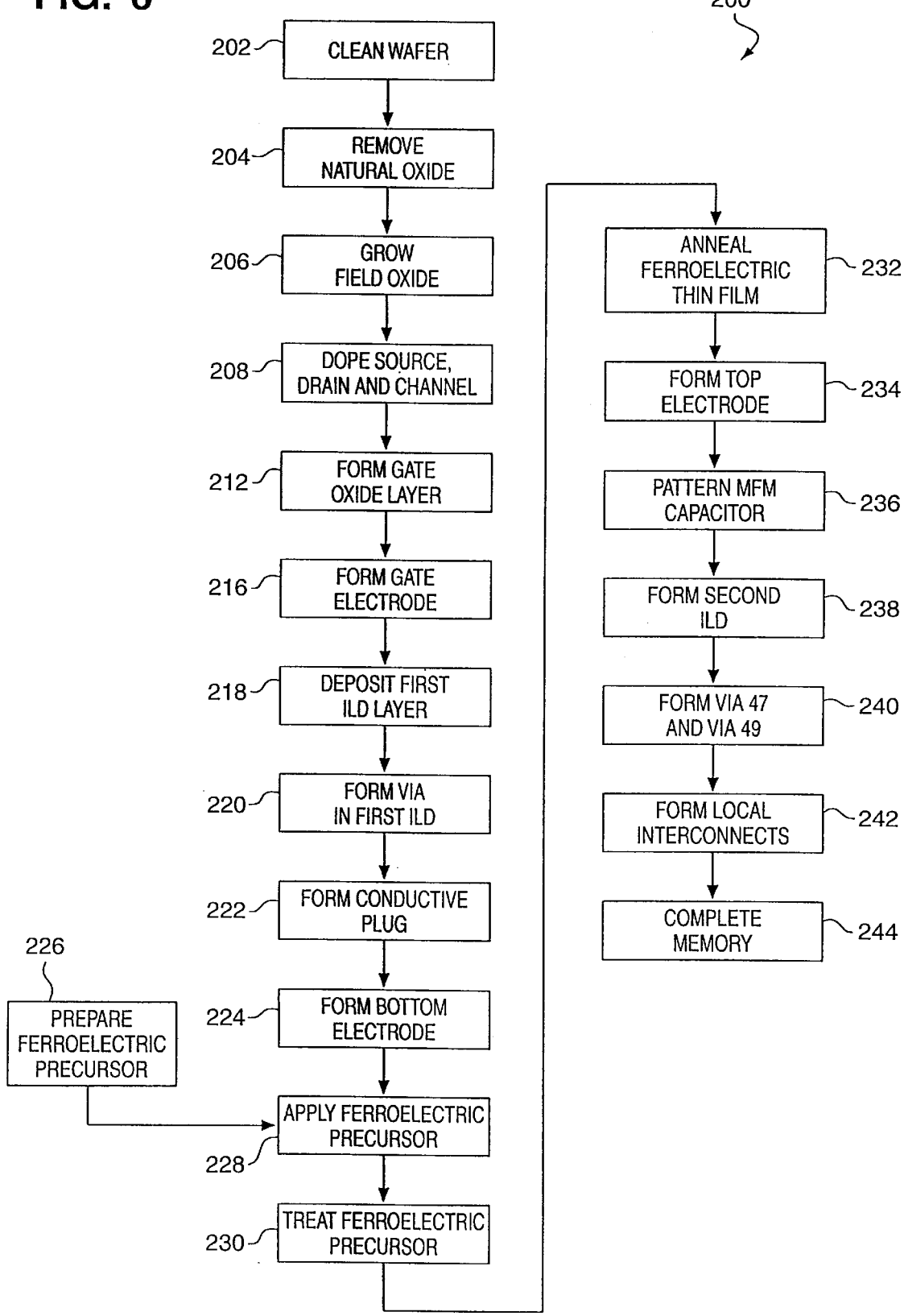
FIG. 6 is a flow chart showing the steps of a generalized liquid source deposition process for fabricating a MFM-MIS FET memory in accordance with the invention.

FIG. 6 is a flow chart showing the steps of a generalized liquid source deposition process 200 for fabricating a ferroelectric MFM-MIS FET memory in accordance with an embodiment of the invention. The fabrication methods disclosed here are discussed in relation to the structure of ferroelectric FET memory 10, depicted in FIG. 1. It is understood, however, that the useful features of the structure and method of the invention can be applied in many variations of the generalized fabrication methods disclosed herein.

In substrate preparation steps 202, wafer 20 is cleaned to remove contaminants, preferably by dipping the wafer into $H_2SO_4$ for 30 minutes. Then in step 204, the wafer is dipped into 10:1 buffered HF solution for five minutes, which removes any natural oxide that may have formed on the wafer. A field oxide 24 is grown in a furnace using conventional techniques, preferably to a thickness of 500 nanometers (nm). In step 208, source/drain regions 26 and 28 and channel region 30 of FET 12 are then formed by a conventional patterning and doping methods. This includes the usual photo resist, etching and strip steps for removal of the field oxide followed preferably by a phosphorous diffusion step. Preferably, the doping of channel region 30 is in the range of $2 \times 10^{15}$ to $10^{17}$ atoms/$cm^3$, and most preferably in the range of $10^{16}$ to $10^{17}$ atoms/$cm^3$, which provides a resistance of about 1 ohm to 5 ohms. Preferably, the doping of the source/drain regions is in the range of $10^{19}$ to $10^{20}$ atoms/$cm^3$.

In step 212, gate oxide layer 31 is formed using conventional techniques. Typically gate oxide layer 31 is formed by processes including oxidation of the semiconductor material 22.

In step 216, gate electrode 34 is formed. Gate electrode 34 preferably comprises polysilicon formed by conventional methods. Alternatively, it may be a layer of sputtered platinum or other conductor. In step 218, a first interlayer dielectric, ILD 36, is deposited, typically by using a spin-on technique. In step 220, via 38 is formed using conventional patterning techniques, including applying photo-resist, etching and ashing. In step 222, via 38 is filled to form conductive plug 39. Via 38 is usually filled by depositing polycrystalline silicon or sputtering tungsten-aluminum, although other materials and techniques may be used.

In step 224, a layer of platinum is sputter deposited on ILD 36 and conductive plug 39, then patterned to form bottom electrode 40. In step 226 of the preferred method, a liquid EMOD precursor of ferroelectric thin film 42 is prepared from initial precursors of the various components of the ferroelectric compound. The ferroelectric compound is typically a complex metal oxide and preferably a layered superlattice material; for example, strontium bismuth tantalate having a stoichiometric formula $SrBi_2Ta_2O_9$. The individual precursors are formed by interacting each of the metals, for example, strontium, bismuth and tantalum, or an alkoxide of the metal, with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5-trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial precursors are usually made or bought in batches prior to their use; the final precursor mixtures are usually prepared immediately before application to the substrate. Final preparation steps typically include mixing, solvent exchange, and dilution. In the examples discussed below, precursors for strontium bismuth tantalum niobate containing metal moieties in relative proportions corresponding to the stoichiometrically unbalanced formula $SrBi_{2.2}(Ta_{1-x}Nb_x)_2O_9$, where $0 \leq x \leq 1$, were used. It is common to include up to ten percent excess bismuth in the precursor, typically 5–10 percent excess. In step 228, the final precursor for ferroelectric thin film 42 may be applied using any liquid source deposition method suitable for EMOD solutions. Preferably, a misted deposition method is used. A CVD method may also be used. The misted deposition and CVD methods may start with a single final precursor, or a multisource method may be used such that individual precursors are mixed in the deposition apparatus just prior to deposition. In the example below, either a two-coat or three-coat liquid spin-on method was used. Forming the ferroelectric thin film includes treatment of the material deposited on the substrate. Treating may comprise one or more processes selected from the group including: exposing to vacuum, exposing to ultraviolet radiation, drying, heating, baking, rapid thermal processing, and annealing. Treatment in step 230 typically includes drying, rapid thermal processing ("RTP"), and annealing. Drying is typically performed for one minute at 160° C., then at 260° C. for four minutes. The RTP is typically done at 725° C. for 30 seconds, with a 100° C./sec ramping rate. In step 232, a furnace anneal, preferably in an oxygen atmosphere at 800° C. for 60 minutes, crystallizes the ferroelectric compound of ferroelectric thin film 42. In step 234, top electrode 44 is formed using conventional methods. Preferably, top electrode 44 comprises platinum that is sputter-deposited to make a layer with 200 nm thickness; but it may be other metals or conductors also. In step 236, MFM capacitor 14 comprising bottom electrode 40, ferroelectric thin film 42 and top electrode 44 is patterned using conventional techniques. Preferably, MFM capacitor 14 is patterned in one sequence of patterning steps to form a self-aligned structure in which bottom electrode 40, ferroelectric thin film 42, and top electrode 44 have the same area. In step 238, a second ILD, ILD 46, is formed to cover MFM capacitor 14 and ILD 36. In step 240, using conventional techniques, wiring hole 47 is patterned and etched through ILD 46 to top electrode 44, and wiring hole 49 is patterned and etched through ILD 46 and ILD 36 to drain region 28. In step 242, using conventional techniques, local interconnect 48 is formed in wiring hole 47, and local interconnect 50 is formed in wiring hole 49. Finally, in step 244, the integrated circuit device is completed, which includes forming metallization layers, passivation layers and packaging.

If an additional insulator layer is formed on the gate oxide layer 31 before forming the gate electrode, then preferably it is formed using an EMOD technique. For an EMOD process, a liquid EMOD precursor solution forforming an insulator layer is prepared. Preferably, the EMOD solution is a 0.2 molar solution of metal 2-ethylhexanoate in n-octane, which is diluted to 0.1 molar concentration with n-butyl acetate solvent just prior to application step 114. The individual precursors are formed by interacting the metal or metals, for example, zirconium, or an alkoxide of the metal, with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5-trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial precursors are usually made or bought in batches prior to their use; the final precursor mixtures are usually prepared immediately before application to the substrate. Final preparation steps typically include mixing, solvent exchange, and dilution. The liquid precursor for the insulator layer is applied to semiconductor substrate 32 using any deposition process suitable for EMOD. Preferably, a liquid-source misted deposition method is used. A liquid-source chemical vapor deposition ("CVD") method may also be used. In the examples described in detail below, a spin-on technique was used to spin on the EMOD precursor solution. After depositing the precursor, the substrate is usually treated to form the additional insulator layer. Treating may comprise a process selected from the group including: exposing to vacuum, exposing to ultraviolet radiation, drying, heating, baking, rapid thermal processing, and annealing. Treatment typically includes drying and annealing. For example, drying is typically performed for one minute at 160° C., then at 260° C. for four minutes. A furnace anneal, preferably in an oxygen atmosphere at 800° C. for 60 minutes, crystallizes the metal oxide compound in the insulator layer.

EXAMPLE 1

Metal-ferroelectric-metal ("MFM") and metal-insulator-semiconductor ("MIS") heterostructures were formed in accordance with the invention, but without the transistor elements (source, drain, gate) of an FET. The electronic properties of the two types of structures were studied separately, and the coercive voltage of the ferroelectric thin film of the MFM capacitors was measured as $2\ V_c$. The two types of structures were connected in series to form a MFM-MIS circuit similar to the preferred embodiment of the invention, but without the FET elements of source, drain and channel. Capacitance versus voltage ("C–V") measurements of the MFM-MIS circuit were performed to determine the memory window, $\Delta V$, and the relationship of $\Delta V$ to $V_c$. Also, the effects of variation of ferroelectric composition and capacitor area were studied.

Figure 7:
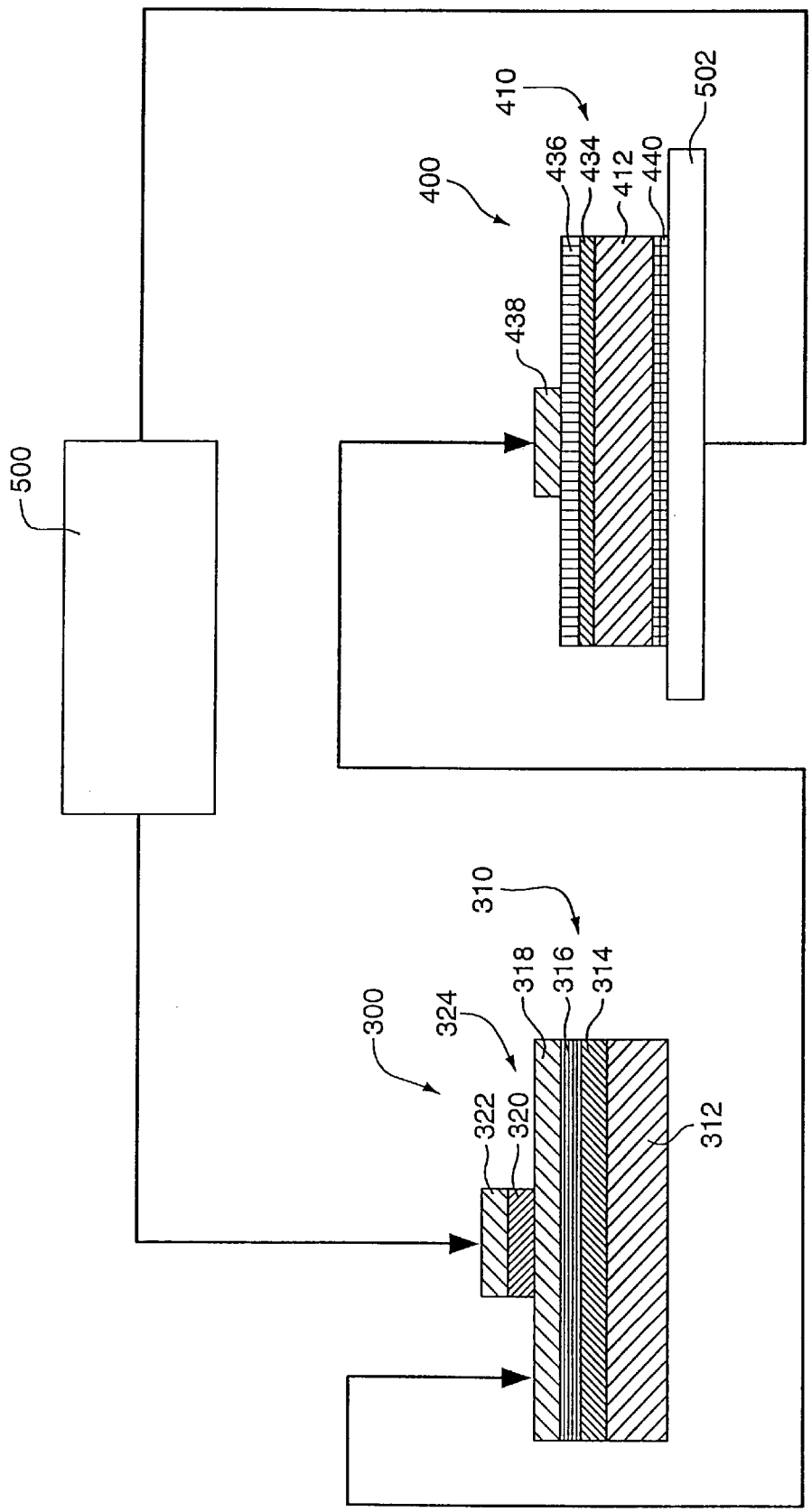
FIG. 7 is a schematic diagram of the MFM and MIS heterostructures and a MFM-MIS circuit system.

FIG. 7 is a schematic diagram of the MFM and MIS heterostructures and the MFM-MIS circuit system. A plurality of ferroelectric MFM capacitors 324 were formed on a series of silicon wafers 310 having a silicon substrate 312, a silicon dioxide layer 314, a titanium adhesion layer 316, a Pt bottom electrode 318, and a Pt top electrode 322. Initial EMOD precursor solutions respectively comprising strontium 2-ethylhexanoate, bismuth 2-ethylhexanoate, tantalum 2-ethylhexanoate and niobium 2-ethylhexanoate in n-octane solvent were used to prepare a 0.2 molar final precursor solution.

Ferroelectric thin film 320 was prepared from the final liquid precursor solution. The 0.2 molar final liquid precursor was made by mixing the initial individual metalorganic precursors for each of the metal elements corresponding to the empirical formula:

$$SrBi_{2.2}(Ta_{1-x}Nb_x)_2O_9, \quad (3)$$

wherein $0 \leq x \leq 1$ and x was varied as indicated in Table 1.

The formation of ferroelectric capacitors containing the layered superlattice compound was described in Watanabe, U.S. Pat. No. 5,434,102, which is hereby incorporated by reference as if wholly contained herein.

A series of prime grade (100)-oriented p-type Si wafers 310 were oxidized to form silicon dioxide layers 314. A layer consisting substantially of titanium was deposited on the substrate. The titanium was oxidized in a furnace anneal to form $TiO_2$ layer 316. Then platinum bottom electrode 318 having a thickness of 300 nm was formed on layer 316. Next, the wafers were dehydrated for 30 minutes at 180° C. in low vacuum.

The final precursor solution was applied onto the substrate using a spin-on technique. As indicated in Table 1, two liquid coatings were applied to most samples; however, three liquid coatings were applied to one set of samples. Just prior to use, the final liquid precursor was diluted to 0.1 molar concentration by adding n-butyl acetate. A first spin-coat of 0.1 molar solution of the strontium bismuth tantalum niobate precursor was deposited on bottom electrode 318 at 1100 rpm for 40 seconds. This was dried for one minute at 160° C., and at 260° C. for four minutes. The first spincoat annealed at 800° C. for 10 minutes with an oxygen flowrate of 5 liters/minute, with 10 minutes "push" and 10 minutes "pull". This sequence of the spin-coating and drying was repeated for a second spincoat. After drying the second spin-coat of the two-coat samples, the wafer was annealed at 800° C. for 60 minutes with an oxygen flowrate of 5 liters/minute, with 10 minutes "push" and 10 minutes "pull". With the three-coat samples, the wafer was annealed for only 10 minutes after the second coat; then the sequence of spin coating and drying was repeated for a third time, and finally the wafer was annealed at 800° C. for 60 minutes. Platinum was sputter-deposited to make top electrode layer 322 with 200 nm thickness. The platinum and strontium bismuth tantalum niobate layers were ion-milled to form the capacitors, and then ashing was performed, followed by a second $O_2$ anneal for 30 minutes at 800° C. The capacitors were patterned variously so that each composition of ferroelectric included a series of MFM capacitors with surface areas, $A_{MFM}$, of 4301, 6940, 10207, 16286, 29559 and 46759 square microns.

TABLE 1

Ferroelectric Thin Film Comprising $SrBi(Ta_{1-x}Nb_x)_2O_9$ in MFM Capacitor

| Composition No. | x | No. of Layers | Thin Film Thickness (nm) |
|---|---|---|---|
| 1 | 0.0 | 2 | 170 |
| 2 | 0.0 | 3 | 240 |
| 3 | 0.2 | 2 | 175 |
| 4 | 0.4 | 2 | 175 |
| 5 | 0.6 | 2 | 175 |
| 6 | 0.8 | 2 | 180 |
| 7 | 1.0 | 2 | 180 |

To make each of the MIS structures 400, a prime grade (100)-oriented p-type silicon wafer 410 having a resistivity of 6–10 Ω-cm was cleaned by dipping in a $H_2O_2/NH_4OH/H_2O$ solution (volume ratio 1/1/8) at 70° C. for 30 minutes. The wafer was rinsed in deionized water, and dried. Then the wafer was dipped in 20:1 buffered HF solution for 20–30 seconds, rinsed in deionized water and dried.

An EMOD method according to the invention was used to deposit a $ZrO_2$ insulator layer 436 on silicon substrate 412. A 0.2M n-octane based solution of zirconium 2-ethylhexanoate was diluted to 0.1M by adding n-butyl acetate. A liquid coating of the 0.1M solution was applied using a spin-on technique, with a coater speed of 1500 rpm for 40 seconds. The coating was dried at 160° C. for one minute, then at 260° C. for four minutes. The spin-coating and drying steps were repeated twice, for a total of three coats. The solid coating was then furnace-annealed for 60 minutes at 800° C. in oxygen flowing at 5 l/m, with 10 minutes "push" and 10 minutes "pull". Measurements using Auger electron spectroscopy ("AES") and transmission electron microscopy ("TEM") indicated that the $ZrO_2$-layer 436 had a thickness of about 13 nm. As a result of the fabrication steps, oxide layer 434 of $SiO_2$ having a thickness of 7 nm was formed by oxidation of silicon substrate 412.

A platinum layer with a thickness of about 200 nm was sputter deposited on $ZrO_2$ insulator layer 436. Then the platinum layer was ion-milled to form electrodes 438, followed by a furnace-anneal in oxygen for 30 minutes at 800° C. After that, the top of the wafer was covered with photoresist while the back side of the wafer was cleaned in a 20:1 buffered HF solution for about two minutes and rinsed in deionized water. Aluminum layer 440 having a thickness of 600 nm was sputter deposited onto the back of wafer 410 using a DC sputtering tool. After removal of the photoresist, the wafer was then furnace-annealed in nitrogen for 30 minutes at 450° C. The MIS capacitors had surface areas, $A_{MIS}$, of 4301, 6940, 10207, 16286, 29559 and 46759 square microns.

As depicted in FIG. 7, LCR meter 500 was used to make capacitance versus voltage ("C=–V") measurements in the MFM-MIS circuit of FIG. 7, as well as to measure the electronic properties of the individual MFM and MIS capacitors 300 and 400. Structure 502 of FIG. 7 represents the probe station stage for measuring with meter 500. LCR meter 500 was a Hewlett-Packard Model No. HP 4284A LCR meter.

Figure 8:
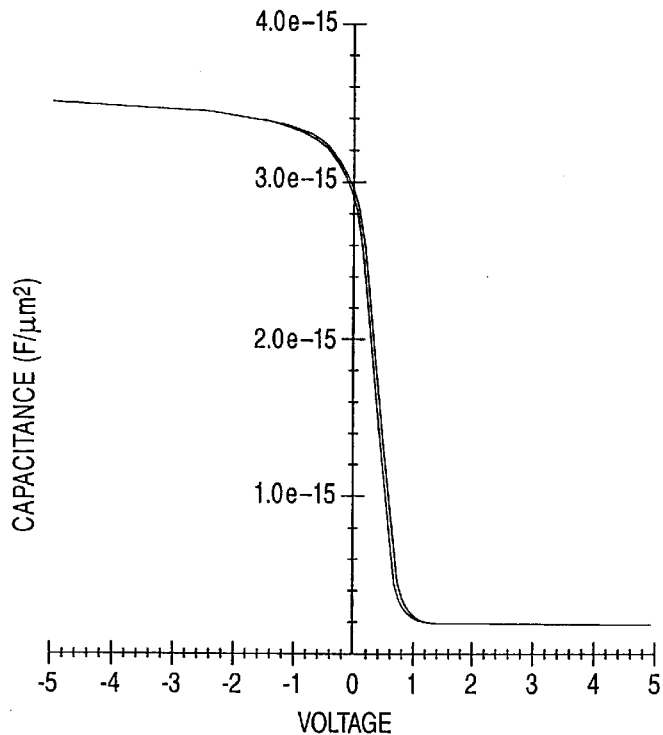
FIG. 8 shows the results of capacitance versus voltage ("C–V") measurements of an exemplary MIS capacitor.

The graph of FIG. 8 shows the results of the C–V measurement of an exemplary MIS capacitor, in which capacitance is expressed in farads ("F") per square micron. The graph shows no hysteresis and indicates, therefore, that there was virtually no effect of charge injection or mobile ions in the MIS capacitors.

Figure 9:
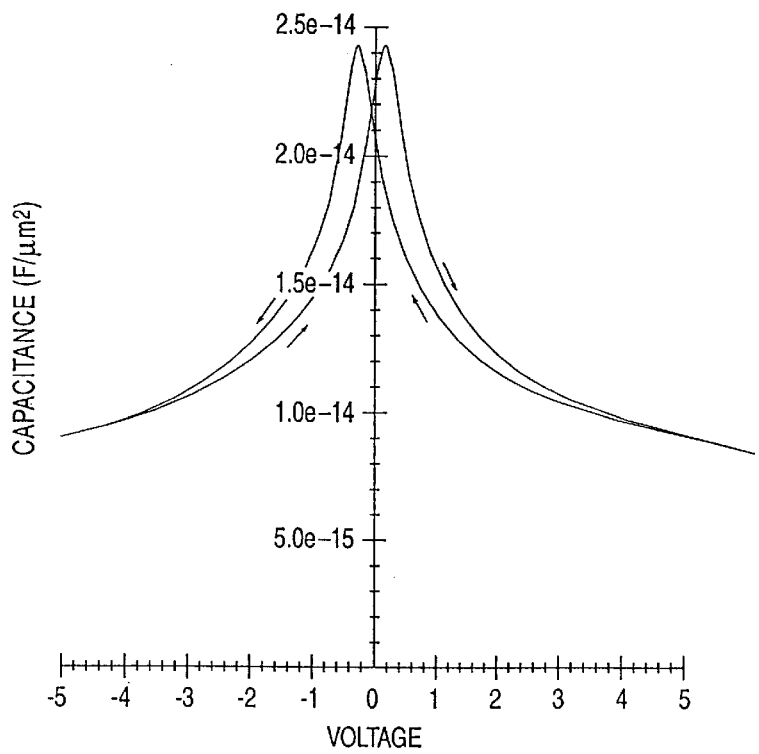
FIG. 9 shows the result of a C–V measurement of an exemplary MFM capacitor.

FIG. 9 shows the result of a C–V measurement of an exemplary MFM capacitor having Composition 1 of Table 1, that is, made from a precursor having metal moieties corresponding to the stoichiometric formula $SrBi_{2.2}Ta_2O_9$, which corresponds to Formula (3) with x=0. The area of the tested exemplary MFM capacitor was 6940 $\mu m^2$. The measurements of the MIS structure were performed by applying an AC signal of 140 mV amplitude and 10 KHz frequency, while a DC electric field was swept in the range ±5 volts as indicated by the arrows on the plotted curves. The value $2 V_c$ of the tested MFM capacitor was calculated by measuring the voltage difference between the two maximum peaks on the graph. The value $2 V_c$ was 0.5 volts. The value of $2 V_c$ in the MFM capacitors having the other compositions, Composition Nos. 2–7, given in Table 1 were calculated in the same way.

Figure 10:
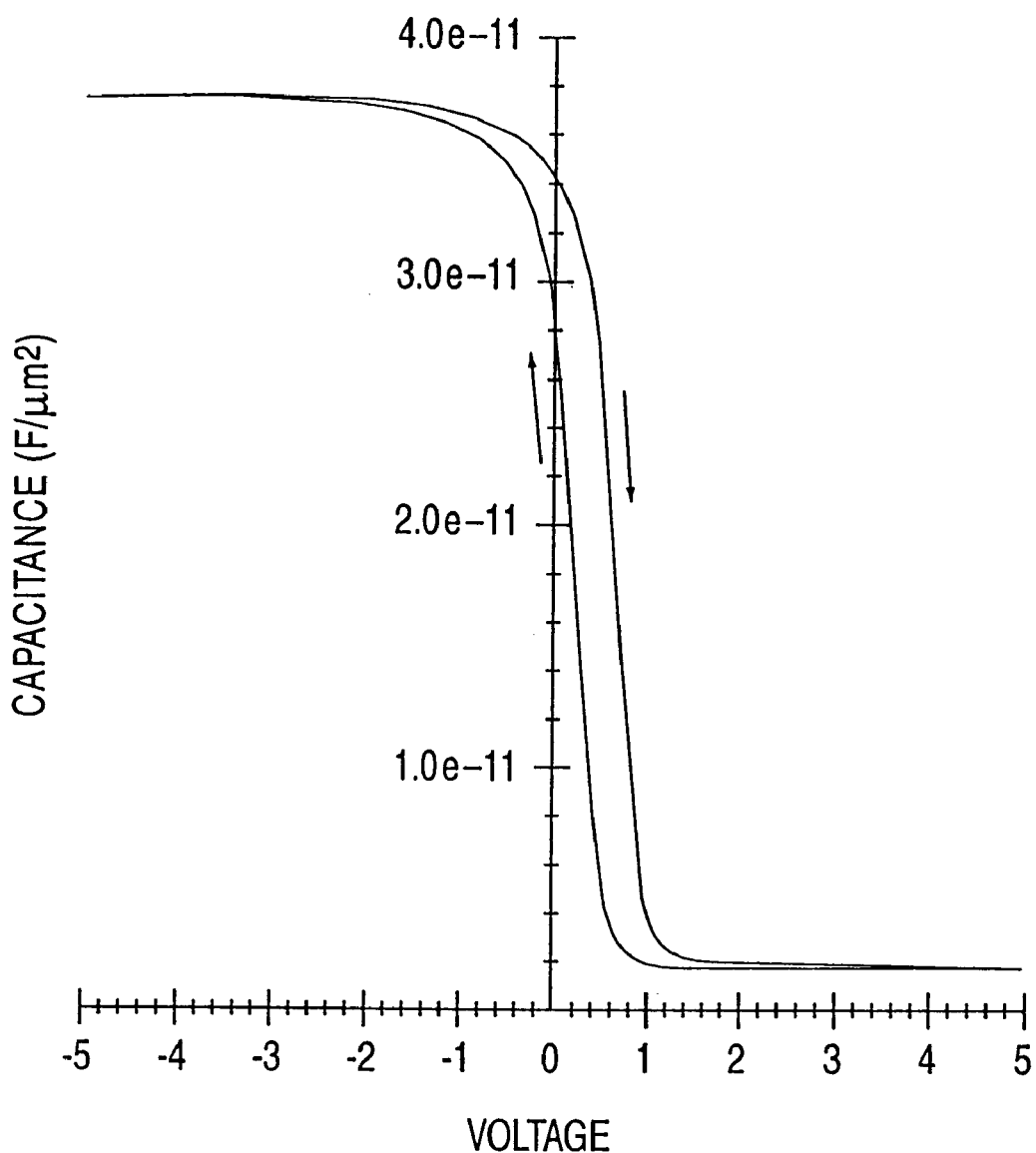
FIG. 10 is a graph of results of C–V measurements performed on a MFM-MIS circuit as depicted in FIG. 7.

FIG. 10 is a graph of results of C-V measurements performed on a MFM-MIS circuit as depicted in FIG. 7. The MFM capacitor of FIG. 10 had the same composition as the example tested for FIG. 9, that is, $SrBi_{2.2}Ta_2O_9$. The MFM capacitor had an area of 46,759 $\mu m^2$, and the MIS had an area of 16,286 $\mu m^2$. The area ratio $A_{MFM}/A_{MIS}$ was, therefore, 2.9. The capacitances, $C_{MFM}$ and $C_{MIS}$, were measured separately, and the ratio $C_{MFM}/C_{MIS}$ was approximately 20. The threshold voltage shift, or "memory window", $\Delta V$, calculated by measuring the maximum voltage difference between the backward and forward sweeps on the graph, was about 0.44 volts. Thus, the memory window, $\Delta V$, of the MFM-MIS system was approximately equal to the value of $2 V_c$ (i.e., $2 V_c$=0.5 volts) of the ferroelectric thin film of the MFM capacitor; the value $\Delta V/2 V_c$ for this combination was about 0.88.

Figure 11:
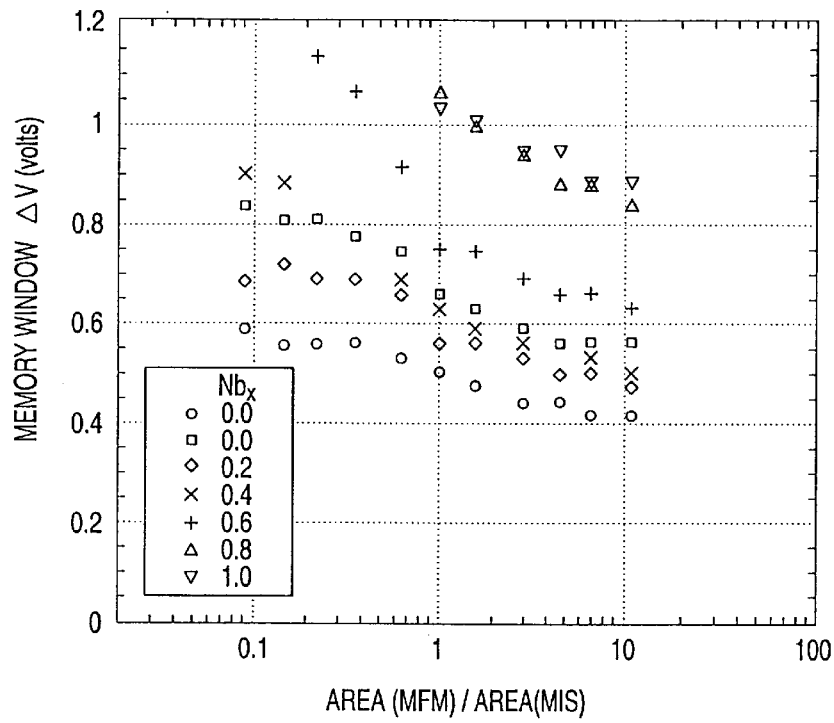
FIG. 11 shows a graph of the value of the memory window, $\Delta V$, measured in a series of exemplary MFM-MIS circuits plotted as a function of area ratio, $A_{MFM}/A_{MIS}$.

The memory window, $\Delta V$, was measured in a several series of MFM-MIS circuits in which the area ratio, $A_{MFM}/A_{MIS}$, was varied. A series of exemplary capacitors was fabricated for each of the seven compositions described in Table 1. Values of $\Delta V$ were measured using C-V graphs similar to FIG. 10. The $\Delta V$ values are plotted in the graph of FIG. 11. The data of FIG. 11 show that for a given composition of ferroelectric, the value of $\Delta V$ increases as the relative area size of the MFM capacitor, $A_{MFM}$, decreases. The data also show that the composition of the ferroelectric thin film significantly affects the value of $\Delta V$. In the examples studied, for a given area ratio, $\Delta V$ is higher when the ferroelectric contains a higher proportion of Nb.

The ratio $\Delta V/2 V_c$ was calculated from the measurements discussed above and plotted on the graph of FIG. 12 as a function of the capacitance ratio $C_{MFM}/C_{MIS}$. The data show that $\Delta V/2 V_c$ increases as the ratio $C_{MFM}/C_{MIS}$ decreases. The ratio $\Delta V/2 V_c$ is also dependent on the proportion of Nb relative to Ta. For example, when the ferroelectric thin film in the MFM capacitors contains relatively small amounts of Nb (i.e., $x \leq 0.2$ in Table 1), then the ratio $\Delta V/2 V_c$ is greater than 1.0 even as $C_{MFM}/C_{MIS}$ has a value of 3.

Figure 12:
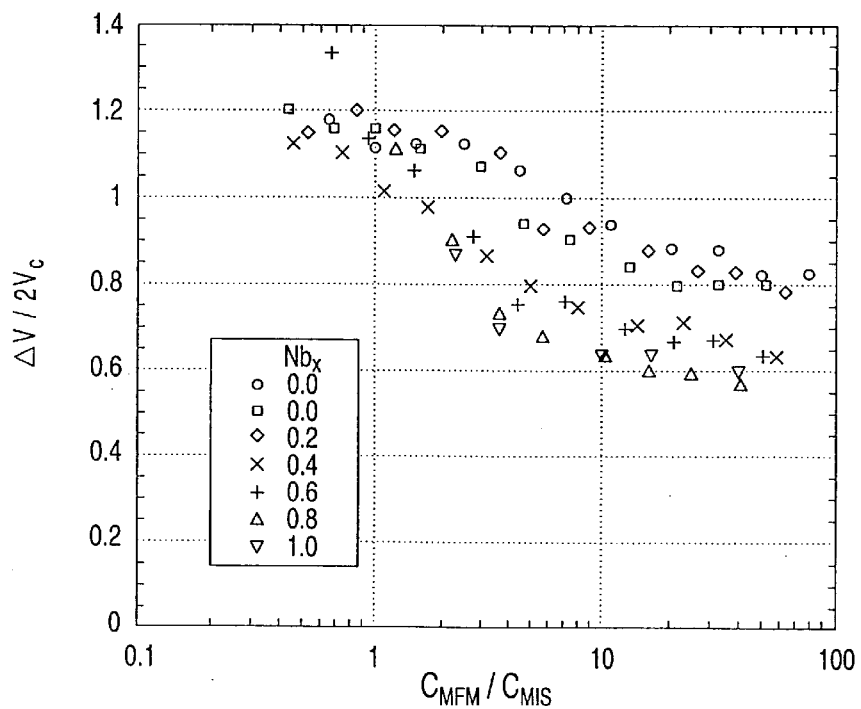
FIG. 12 is a graph of $\Delta V/2V_c$ plotted as a function of the capacitance ratio, $C_{MFM}/C_{MIS}$, in the exemplary MFM-MIS circuits.
Figure 13:
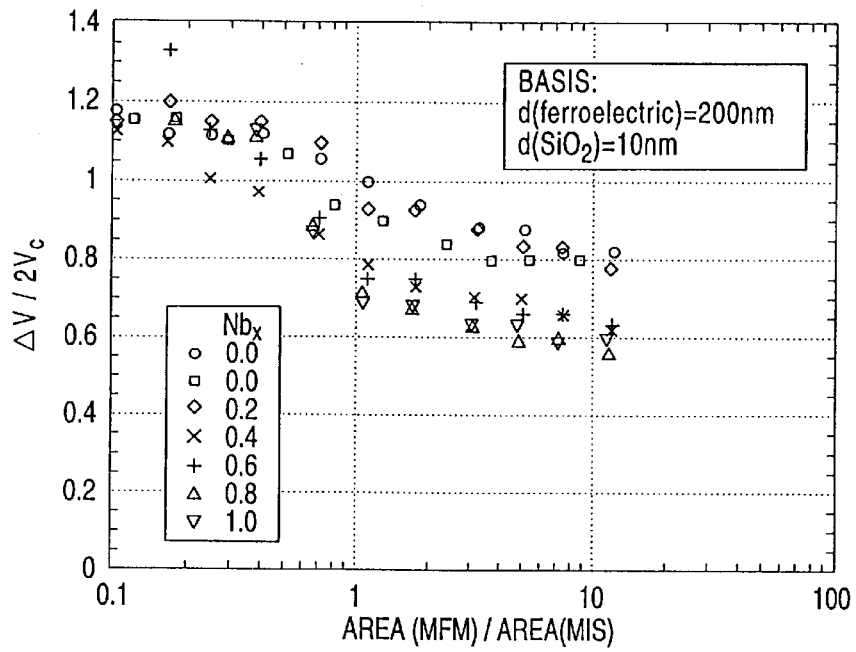
FIG. 13 is a graph in which the data of FIG. 12 were recalculated and plotted based on an idealization in which the thickness of the ferroelectric thin films of all MFM capacitors would be 200 nm, and the composition of the MIS capacitor would be pure $SiO_2$, having a thickness of 10 nm.

In FIG. 13, the data of FIG. 12 were recalculated and presented slightly differently. In FIG. 13, for calculational and presentation purposes, the thickness of the ferroelectric thin films of all MFM capacitors was idealized to be 200 nm. The "insulator" of the MIS capacitor was idealized to be pure $SiO_2$, having a thickness of 10 nm. This idealization is useful to show the effect of not including a separate insulator layer, such as $ZrO_2$, in the MIS structure. The position of the data points in FIG. 13 shows that, in order to achieve values of $\Delta V/2 V_c$ greater than 1 in a MFM-MIS system having no insulator layer, it would be necessary to have an area ratio $A_{MFM}/A_{MIS}$ less than 1.0.

Figure 14:
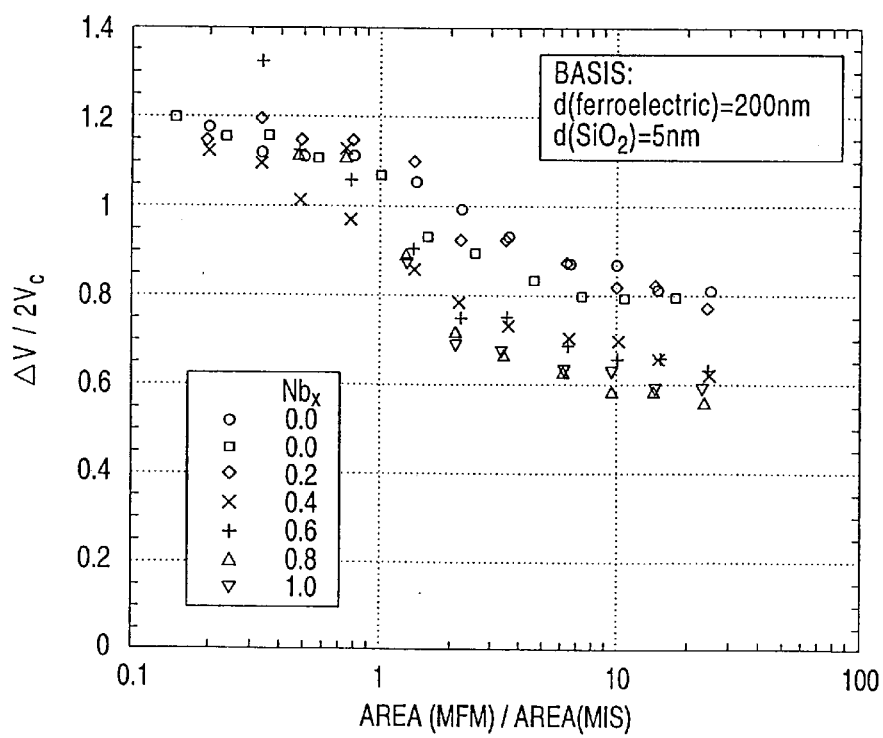
FIG. 14 is a graph in which the data was plotted as in FIG. 13, but based on an idealization in which the thickness of the MIS capacitor would be 5 nm.

In FIG. 14, the data were plotted as in FIG. 13, but based on the idealization that the "insulator" in the MIS structure was pure $SiO_2$, having a thickness of 5 nm. The effect of decreasing the thickness of the insulator would be that a value of $\Delta V/2 V_c$ greater than 1 could be achieved with a larger area ratio, $A_{MFM}/A_{MIS}$, than in FIG. 13.

Figure 15:
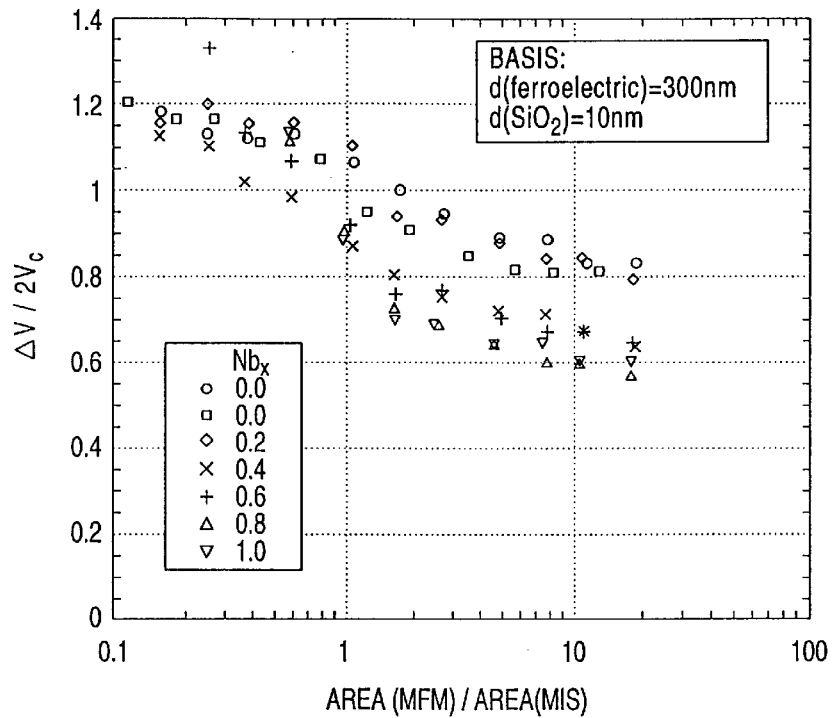
FIG. 15 is a graph in which the data was plotted as in FIG. 13, but based on an idealization in which the thickness of the ferroelectric thin film of the MFM capacitor would be 300 nm.

In FIG. 15, the data were plotted as in FIG. 13, but based on the idealization that the ferroelectric thin film in the MFM structure had a thickness of 300 nm, instead of 200 nm. The effect of increasing the thickness of the ferroelectric thin film would be that a given value of $\Delta V/2 V_c$ could be achieved with a slightly larger area ratio, $A_{MFM}/A_{MIS}$, than under the conditions of FIG. 13.

Figure 16:
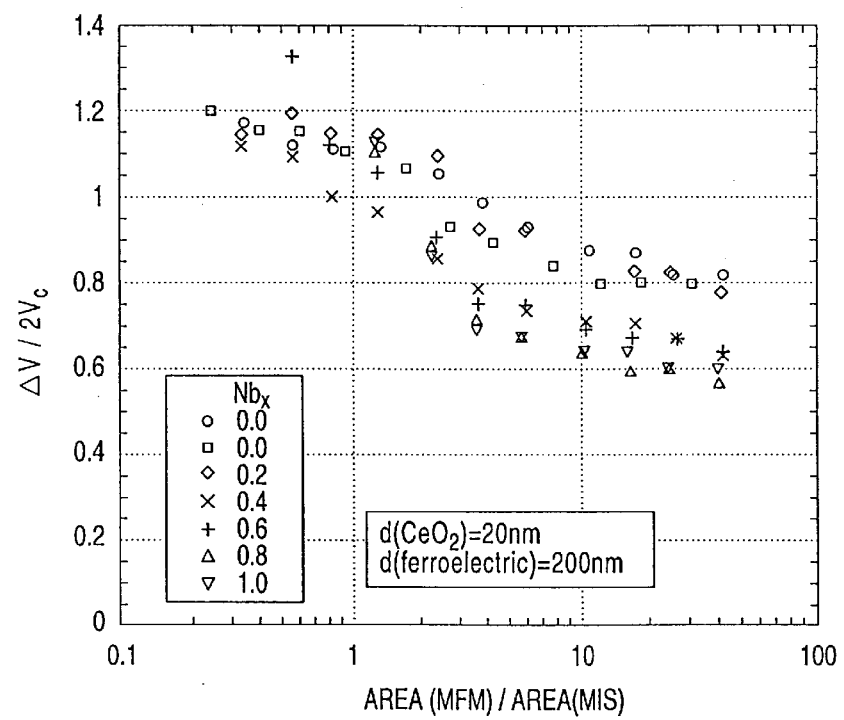
FIG. 16 is a graph in which the data was plotted as in FIG. 13, but based on an idealization in which the thickness of the insulator in the MIS capacitor would be pure $CeO_2$, having a thickness of 20 nm.

Finally, in FIG. 16, the data were plotted as in FIG. 13, but based on the idealization that the "insulator" in the MIS structure was pure $CeO_2$, having a thickness of 20 nm and a known dielectric constant. The result is that the data points of FIG. 13 are shifted significantly to the right. The effect of the idealized insulator would be that a given value of $\Delta V/2 V_c$ could be achieved with a larger area ratio, $A_{MFM}/A_{MIS}$, than in FIG. 13.

There has been described a novel MFM-MIS FET memory device and a method for fabricating such a ferroelectric NDRO memory device in an integrated circuit. The MFM capacitor is separated by an interlayer dielectric layer from the FET and the semiconductor substrate. This provides flexibility in the design and manufacture of the size areas and capacitance of the MFM and MIS capacitors. The analysis of the measurements on the examples presented herein show that the hysteresis memory window in an embodiment of the invention can be increased by decreasing the capacitance ratio, $C_{MFM}/C_{MIS}$ and that the capacitance ratio can be influenced by changing the area ratio, $A_{MFM}/A_{MIS}$, the composition of the ferroelectric and insulating materials, and the thicknesses of the ferroelectric and insulating thin films. It should be understood that the particular embodiments shown in the drawings and described within this specification are for purposes of example and should not be construed to limit the invention, which will be described in the claims below. For example, the invention contemplates that the insulator may comprise a wide range of materials that can be deposited using an EMOD technique. Similarly, the ferroelectric thin film in the ferroelectric MFM capacitor of the invention may be made of any ferroelectric material. Further, it is evident that those skilled in the art may now make numerous uses and modifications of the specific embodiments described, without departing from the inventive concepts. It is also evident that the steps recited may in some instances be performed in a different order; or equivalent structures and processes may be substituted for the structures and processes described. As will be evident to those skilled in the art, any combination of the various embodiments of the components of the memory described herein that can reasonably be combined may be used. Consequently, the invention is to be construed as embracing each and every novel feature and novel combination of features present in and/or possessed by the fabrication processes, compositions, electronic devices, and electronic device manufacturing methods described.

What is claimed is:

1. A ferroelectric FET memory comprising:
   a semiconductor substrate;
   a gate electrode;
   an interlayer dielectric layer; and
   a ferroelectric capacitor having a bottom electrode, a ferroelectric thin film and a top electrode;
   said ferroelectric capacitor being above said semiconductor substrate; said interlayer dielectric layer separating said ferroelectric capacitor from said semiconductor substrate; and said gate electrode being electrically connected to said bottom electrode of said ferroelectric capacitor.

2. A ferroelectric FET memory as in claim 1, wherein said ferroelectric capacitor and said gate electrode form a stacked structure in which said ferroelectric capacitor is located substantially directly above said gate electrode.

3. A ferroelectric FET memory as in claim 2, further comprising an electrically conductive plug, wherein said bottom electrode of said capacitor has a bottom surface and said gate electrode is electrically connected to said bottom surface by said conductive plug.

4. A ferroelectric FET memory as in claim 1, wherein said ferroelectric capacitor and said gate electrode form a strapped structure in which said ferroelectric capacitor is located towards a side of said gate electrode.

5. A ferroelectric FET memory as in claim 4, wherein said bottom electrode has an upper surface and wherein said gate electrode is electrically connected to said upper surface of said bottom electrode by a local interconnect.

6. A ferroelectric FET memory as in claim 1, wherein said gate electrode on said semiconductor substrate characterizes a MIS capacitor, said MIS capacitor having a MIS capacitor area $A_{MIS}$, and said ferroelectric capacitor characterizes a MFM capacitor, said MFM capacitor having a MFM capacitor area $A_{MFM}$.

7. A ferroelectric FET memory as in claim 6, wherein the ratio of areas, $A_{MFM}/A_{MIS}$, does not exceed 10.

8. A ferroelectric FET memory as in claim 6, wherein the ratio of areas, $A_{MFM}/A_{MIS}$, does not exceed 1.0.

9. A ferroelectric FET memory as in claim 6, wherein the ratio of areas, $A_{MFM}/A_{MIS}$, does not exceed 0.1.

10. A ferroelectric FET memory as in claim 1, wherein said gate electrode on said semiconductor substrate has a MIS capacitance, $C_{MIS}$; said ferroelectric capacitor has a MFM capacitance, $C_{MFM}$; and the ratio of said MFM capacitance to said MFM capacitance, $C_{MFM}/C_{MIS}$ does not exceed 10.

11. A ferroelectric FET memory as in claim 1, wherein said gate electrode on said semiconductor substrate has a MIS capacitance, $C_{MIS}$; said ferroelectric capacitor has a MFM capacitance, $C_{MFM}$; and the ratio of said MFM capacitance to said MFM capacitance, $C_{MFM}/C_{MIS}$, does not exceed 1.0.

12. A ferroelectric FET memory as in claim 1, wherein said gate electrode on said semiconductor substrate has a MIS capacitance, $C_{MIS}$; said ferroelectric capacitor has a MFM capacitance, $C_{MFM}$; and the ratio of said MFM capacitance to said MFM capacitance, $C_{MFM}/C_{MIS}$, does not exceed 0.1.

13. A ferroelectric FET memory as in claim 1, wherein said ferroelectric thin film comprises a ferroelectric metal oxide.

14. A ferroelectric FET memory as in claim 13, wherein said ferroelectric metal oxide is a ferroelectric layered superlattice material.

15. A ferroelectric FET memory as in claim 14, wherein said ferroelectric layered superlattice material comprises strontium, bismuth, tantalum and niobium in relative molar proportions corresponding to the stoichiometric formula $SrBi_y(Ta_{1-x}Nb_x)_2O_9$, wherein $0 \leq x \leq 1$ and $2.0 \leq y \leq 2.2$.

16. A ferroelectric FET memory as in claim 1, wherein said ferroelectric thin film has a thickness in the range of 30 nm to 500 nm.

17. A ferroelectric FET memory as in claim 1, wherein said ferroelectric thin film has a thickness in the range of 100 nm to 300 nm.

18. A ferroelectric FET memory as in claim 1, wherein said ferroelectric thin film has a thickness exceeding 150 nm.

19. A ferroelectric FET memory as in claim 1 wherein said semiconductor substrate includes a gate oxide layer and said gate electrode is located above said gate oxide layer.

20. A ferroelectric FET memory as in claim 19, further comprising an insulator layer located between said gate oxide and said gate electrode.

21. A ferroelectric FET memory as in claim 20, wherein said insulator layer comprises a metal oxide selected from the group consisting of $ZrO_2$, $CeO_2$, $Y_2O_3$ and $(Ce_{1-x}Zr_x)O_2$, wherein $0 \leq x \leq 1$.

22. A ferroelectric FET memory as in claim 20, wherein said insulator layer has a thickness not exceeding 20 nm.

* * * * *